(12) United States Patent
Poppe et al.

(10) Patent No.: US 9,425,772 B2
(45) Date of Patent: Aug. 23, 2016

(54) COUPLING RESISTANCE AND CAPACITANCE ANALYSIS SYSTEMS AND METHODS

(75) Inventors: Wojciech Jakub Poppe, San Jose, CA (US); Ilyas Elkin, Sunnyvale, CA (US); Puneet Gupta, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/528,725

(22) Filed: Jun. 20, 2012

(65) Prior Publication Data

US 2013/0027140 A1    Jan. 31, 2013

Related U.S. Application Data

(60) Provisional application No. 61/512,362, filed on Jul. 27, 2011.

(51) Int. Cl.
*H03K 3/03*     (2006.01)
*G01R 31/28*    (2006.01)

(52) U.S. Cl.
CPC ......... *H03K 3/0315* (2013.01); *G01R 31/2853* (2013.01)

(58) Field of Classification Search
USPC ...................................... 331/57, 44, 45, 105
See application file for complete search history.

(56) References Cited

U.S. PATENT DOCUMENTS

| | | |
|---|---|---|
| 4,922,140 A | 5/1990 | Gahle et al. |
| 5,553,276 A | 9/1996 | Dean |
| 5,835,553 A | 11/1998 | Suzuki |
| 5,973,507 A | 10/1999 | Yamazaki |
| 6,023,430 A | 2/2000 | Izumikawa |
| 6,242,960 B1 | 6/2001 | Bae |
| 6,401,018 B1 | 6/2002 | Oba et al. |
| 6,535,013 B2 | 3/2003 | Samaan |
| 6,535,071 B2 * | 3/2003 | Forbes ............................ 331/57 |

(Continued)

FOREIGN PATENT DOCUMENTS

| | | |
|---|---|---|
| CN | 101144741 A | 3/2008 |
| CN | 102098028 A | 6/2011 |

(Continued)

OTHER PUBLICATIONS

Basab Datta et al., "Analysis of a Ring Oscillator Based on Chip Thermal Sensor in 65nm Technology", VLSI Design Principles (ECE 658) Lab 4 Project, University of Massachusetts-Amherst, Dec. 23, 2005.

(Continued)

*Primary Examiner* — Jeffrey Shin

(57) ABSTRACT

The described systems and methods can facilitate examination of device parameters including analysis of relatively dominant characteristic impacts on delays. In one embodiment, at least some coupling components (e.g., metal layer wires, traces, lines, etc.) have a relatively dominant impact on delays and the delay is in part a function of both capacitance and resistance of the coupling component. In one embodiment, a system comprises a plurality of dominant characteristic oscillating rings, wherein each respective one of the plurality of dominant characteristic oscillating rings includes a respective dominant characteristic. Additional analysis can be performed correlating the dominant characteristic delay impact results with device fabrication and operation.

19 Claims, 11 Drawing Sheets

(56) References Cited

U.S. PATENT DOCUMENTS

| | | |
|---|---|---|
| 6,724,225 B2 | 4/2004 | Joshi et al. |
| 6,801,096 B1 | 10/2004 | Nariman et al. |
| 6,854,100 B1 | 2/2005 | Chuang et al. |
| 6,882,172 B1 | 4/2005 | Suzuki et al. |
| 6,998,901 B2 | 2/2006 | Lee |
| 7,064,620 B1 | 6/2006 | Lai et al. |
| 7,085,658 B2 | 8/2006 | Bhushan et al. |
| 7,151,417 B1 | 12/2006 | Suzuki |
| 7,180,794 B2 | 2/2007 | Matsue |
| 7,282,975 B2 | 10/2007 | Burton et al. |
| 7,315,221 B2 | 1/2008 | Ha et al. |
| 7,332,937 B2 | 2/2008 | Hsu et al. |
| 7,365,611 B2 | 4/2008 | Ikeda et al. |
| 7,489,204 B2 | 2/2009 | Habitz et al. |
| 7,535,128 B2 | 5/2009 | Wang et al. |
| 7,550,998 B2 | 6/2009 | Brazis et al. |
| 7,592,876 B2 | 9/2009 | Newman |
| 7,642,864 B2 | 1/2010 | Chuang et al. |
| 7,760,033 B2 | 7/2010 | Podmanik et al. |
| 7,795,927 B2 | 9/2010 | Farwell |
| 7,804,372 B2 | 9/2010 | Nakatani |
| 7,868,706 B2 | 1/2011 | Nissar et al. |
| 7,908,109 B2 | 3/2011 | Good et al. |
| 8,041,518 B2 | 10/2011 | McIntyre et al. |
| 8,081,035 B2 | 12/2011 | Wood |
| 8,143,919 B2 | 3/2012 | Kurokawa |
| 8,193,833 B2 | 6/2012 | Inukai |
| 8,247,906 B2 | 8/2012 | Law et al. |
| 8,378,754 B2 | 2/2013 | Yamamoto |
| 2003/0001185 A1 | 1/2003 | Sell et al. |
| 2003/0034848 A1 | 2/2003 | Norman et al. |
| 2005/0007154 A1 | 1/2005 | Patella et al. |
| 2005/0012556 A1* | 1/2005 | Bhushan et al. ............ 331/57 |
| 2006/0028241 A1 | 2/2006 | Apostol et al. |
| 2006/0161797 A1 | 7/2006 | Grass et al. |
| 2006/0178857 A1 | 8/2006 | Barajas |
| 2007/0273450 A1 | 11/2007 | Burton et al. |
| 2008/0094053 A1 | 4/2008 | Han et al. |
| 2009/0045834 A1 | 2/2009 | Farwell |
| 2009/0096495 A1 | 4/2009 | Keigo |
| 2010/0102891 A1 | 4/2010 | Nissar et al. |
| 2010/0189160 A1 | 7/2010 | Kim et al. |
| 2010/0327983 A1 | 12/2010 | Yamamoto |
| 2011/0101998 A1 | 5/2011 | Myers et al. |
| 2013/0021107 A1 | 1/2013 | Poppe et al. |
| 2013/0106438 A1 | 5/2013 | Elkin et al. |
| 2013/0106524 A1 | 5/2013 | Elkin et al. |
| 2013/0110437 A1 | 5/2013 | Singh et al. |

FOREIGN PATENT DOCUMENTS

| | | |
|---|---|---|
| DE | 102004001668 A1 | 8/2005 |
| DE | 102006005848 A1 | 8/2006 |
| DE | 102004001668 B4 | 9/2007 |
| DE | 10063996 B4 | 6/2009 |
| KR | 10-2001-0035660 A | 5/2001 |
| TW | 200403779 A | 3/2004 |
| TW | 200419688 A | 10/2004 |
| TW | 200943719 A | 10/2009 |
| TW | 201103116 A | 1/2011 |
| TW | 201118392 A | 6/2011 |

OTHER PUBLICATIONS

Klass, Fabian; "Design for Yield Using Statistical Design," EE380 Computer Systems Colloquium, Stanford University, Feb. 7, 2007.

Harshada Vinayak Khare, "Design of an On-Chip Thermal Sensor using Leakage Current of a Transistor", Jan. 2010 Thesis University of Minnesota.

* cited by examiner

400

---

410
Performing a dominate characteristic ring oscillation process.

---

420
Performing an analysis process.

510
Performing a high channel resistance low coupling capacitance process.

520
Performing a high channel resistance high coupling capacitance process.

530
Performing a low channel resistance low coupling capacitance process.

540
Performing a low channel resistance high coupling capacitance process.

610
Receiving an indication associated with a dominate characteristic.

620
Determining a transition delay time, wherein the transition delay time is impacted by a dominate characteristic.

630
Analyzing characteristics of a device based upon the transition delay time.

FIG 6

COUPLING RESISTANCE AND CAPACITANCE ANALYSIS SYSTEMS AND METHODS

RELATED APPLICATIONS

This application claims benefit of and priority to Application 61/512,362 entitled Digital Extraction of Metal Resistance and Capacitance filed on Jul. 27, 2011, which is incorporated herein by reference; this application also claims benefit of and priority to Application 61/511,021 entitled Digital Extraction of Via Resistance and Failure Rate filed on Jul. 22, 2011 and Application 61/513,508 entitled Digital Extraction of Via Resistance and Failure Rate filed on Jul. 29, 2011.

FIELD OF THE INVENTION

The present invention relates to examining semi-conductor chip component operations. In particular, the present invention relates to a system and method for examining impacts associated with resistance current.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. The manner in which the electronic devices perform operations can have a significant impact on the performance and end results. However, traditional attempts at accurately analyzing different aspects of device fabrication and operation are often limited and can be very complex and complicated.

As process dimensions shrink, impacts to critical paths are becoming progressively dominated by metal capacitance and resistance dominant delays. Significant resources are often spent on extraction tools, signal integrity analysis, and metal margining. A dearth of longitudinal cross production process data can lead to overly pessimistic margins that unnecessarily eat up silicon area. Metal sheet resistance tracking is regularly attempted by device foundries, but that is usually only one part of the equation and often over simplifies a 3D problem into a 1D measurement. Metal dominated ring oscillators (RO) have also been used to attempt to gain insight, but usually come up short as even metal dominated ring oscillators are sensitive to both metal resistance and capacitance, which vary in tandem.

SUMMARY

The described systems and methods can facilitate examination of device parameters including analysis of relatively dominant characteristic impacts on delays. In one embodiment, at least some coupling components (e.g., metal layer wires, traces, lines, etc.) have a relatively dominant impact on delays and the delay is in part a function of both capacitance and resistance of the coupling component. In one embodiment, a system comprises a plurality of dominant characteristic oscillating rings, wherein each respective one of the plurality of dominant characteristic oscillating rings includes a respective dominant characteristic based upon: a coupling resistance relative to a channel resistance; and a coupling capacitance relative to a coupling capacitance of another respective one of the plurality of dominant characteristic oscillating rings. The system can also include an analysis component operable to analyze an indication of the respective dominant characteristic (e.g., metal wire capacitance, metal wire resistance, etc.) associated with each respective one of the plurality of dominant characteristic oscillating rings. Additional analysis can be performed correlating the dominant characteristic delay impact results with device fabrication and device operations.

DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 4 is a flow chart of an exemplary metal analysis method in accordance with one embodiment of the present invention.

FIG. 5 is a flow chart of an exemplary dominant characteristic ring oscillation process in accordance with one embodiment of the present invention.

FIG. 6 is a flow chart of an exemplary analysis process in accordance with one embodiment of the present invention.

DETAILED DESCRIPTION

Figure 1:
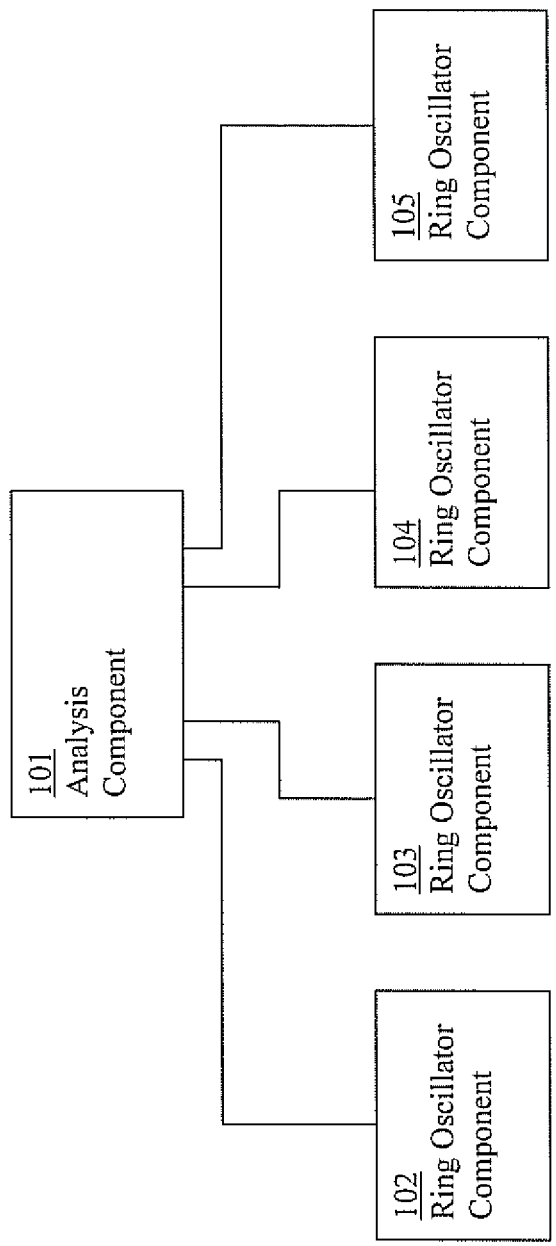
FIG. 1 is a block diagram of an exemplary metal analysis system in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The described systems and methods can facilitate examination of device parameters. The described systems and methods can facilitate analysis of relatively dominant characteristic impacts on delays. In one embodiment, at least some coupling components (e.g., metal layer wires, traces, lines, etc.) have a relatively dominant impact on delays and the delay is in part a function of both capacitance and resistance of the coupling component. In one exemplary implementation, a device includes at least one coupling component loaded ring oscillator (e.g., metal layer wire loaded ring oscillator, etc.) that has a coupling or wire delay that is a function of both capacitance and resistance. The delay associated with the coupling component capacitance and resistance can be examined and the results utilized in analysis of fabrication processes and device operations.

In one embodiment, the systems and method can facilitate segregation and analysis of delays associated with transistor speed and delays associated metal resistance and metal capacitance. A plurality of dominant characteristic oscillating rings can be utilized to enable segregation of the capacitance and resistance indications. In one embodiment, each of the dominant characteristic oscillating rings includes a dominant characteristic that impacts signal transition timing delays. The dominant characteristic can include combinations of resistance (e.g., high/low transistor channel resistance relative to wire coupling resistance, etc.) and capacitance (e.g., high/low wire capacitance in one ring relative to high/low wire capacitance in another ring, etc.). It is appreciate that references to wire can include metal layer wires or metal layer lines in a semiconductor device.

In one embodiment, the dominant characteristic of each of the oscillating rings can be different and utilized in combined analysis to isolate parameter impacts. In one exemplary implementation, a first analysis is made of delay impacts associated with coupling capacitance (e.g., metal wire, metal line, etc.) of ring oscillators in which the coupling resistance plays a relatively small role (e.g., by increasing resistance of another component, channel resistance, etc.). A second analysis is made of delay impacts of ring oscillators in which the coupling resistance plays a relatively larger role (e.g., by increasing resistance of another component, channel resistance, etc.) and the results from the first analysis can be utilized to factor out the delay impact contribution of coupling capacitance from the delay impact contribution of coupling resistance. Additional information regarding dominant characteristic ring oscillators and analysis of the delay indications is set forth in following sections of the detailed description.

FIG. 1 is a block diagram of an exemplary metal analysis system 100 in accordance with one embodiment of the present invention. Metal analysis system 100 includes analysis component 101, dominant characteristic ring oscillator 102, dominant characteristic ring oscillator 103, dominant characteristic ring oscillator 104, and dominant characteristic ring oscillator 105. Dominant characteristic ring oscillators 102, 103, 104 and 105 are operable to oscillate signal transitions, wherein transition timing and delays are impacted by a dominant characteristic of the respective dominant characteristic ring oscillators 102, 103, 104 and 105. It is appreciated that the dominant characteristic can include a variety of different characteristics (e.g., high channel resistance, low channel resistance, high coupling capacitance, low coupling capacitance, etc.). Analysis component 101 is operable to analyze indications associated with the respective dominant characteristics. In one embodiment, analysis component 101 is operable to analyze a frequency and delays in transitions of respective signals forwarded from the dominant characteristic ring oscillators. In one exemplary implementation, analysis component 101 is operable to correlate delays in transitions of respective signals forwarded from the dominant characteristic ring oscillators to coupling resistance and coupling capacitance included in at least one of the dominant characteristic ring oscillators.

In order not to obfuscate the invention, much of the detailed description is directed to exemplary embodiments that include a transistor channel resistance (e.g. of a driving inverter gate, etc.) and coupling metal layer wires. More generally, an inversion stage includes a role resistance component and a coupling component. In one exemplary implementation, the role resistance component includes a transistor channel and a coupling component includes a metal layer coupling (e.g., wire, line, trace, etc.). A role resistance component is any type of component that can be utilized to influence the comparative impact of a coupling component resistance on a transition timing or delay. The role resistance component can have a resistance that has a greater or lesser comparative impact or influencing "role" on a signal transition delay than a coupling component resistance. In one embodiment, the greater or higher the resistance of the role resistance component as compared to the resistance of the coupling component, the greater or more proportionally significant the impact of the role resistance component on the delay of a transition as compared to a coupling component resistance.

Figure 2:
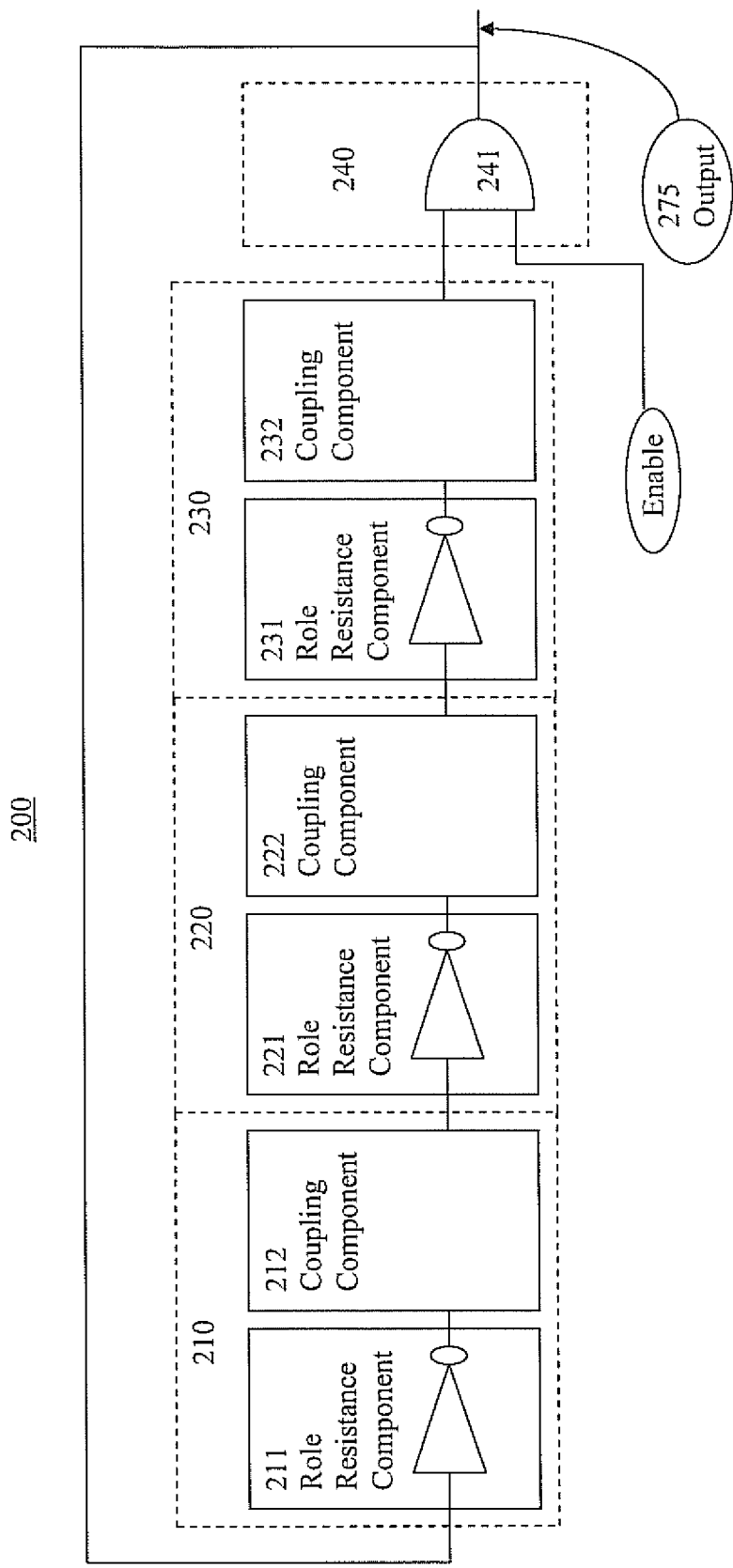
FIG. 2 is a block diagram of an exemplary dominant characteristic ring oscillator in accordance with one embodiment of the present invention.

FIG. 2 is a block diagram of an exemplary dominant characteristic ring oscillator 200 in accordance with one embodiment of the present invention. In one embodiment, a dominant characteristic ring oscillator similar to dominant characteristic ring oscillator 200 can be utilized as a dominant characteristic ring oscillator (e.g., 102, 103, 104, 105, etc.) in dominant characteristic analysis system 100. Dominant characteristic ring oscillator 200 includes inversion stage 210, inversion stage 220, inversion stage 230, control component 240 and output 275. The inversion stages are operable to cause at least one respective inversion transition in a signal. The respective inversion transition in the signal is impacted by the respective dominant characteristic of the inversion stages. In one embodiment, the dominant characteristic can impact timing or delay of a signal transition through an inversion stage. It is appreciated the dominant characteristic can include a variety of different characteristics (e.g., a high channel resistance, low channel resistance, high coupling capacitance, low coupling capacitance, etc.). Control component 240 is operable to control a state of the signal. Output 275 is operable to output a signal.

Inversion stage 210 includes role resistance component 211 and coupling component 212. Inversion stage 220 includes role resistance component 221 and coupling component 222. Inversion stage 230 includes role resistance component 231 and coupling component 232. In one embodiment, the role resistance components include inverters that are operable to cause at least one respective inversion transition in a signal and the coupling components are operable to convey the respective signal transitions to another stage. In one embodiment, the inverters are configured to include at least one transistor (e.g., an inverter driver gate, pull-up transistor, etc.) that has a dominant channel resistance characteristic. In one embodiment, the coupling components are configured to have a dominant coupling capacitance characteristic (e.g., relatively high coupling capacitance, relatively low coupling capacitance, etc). The respective inversion transition in the signal is impacted by the respective dominant characteristic of the inversion stages. In one embodiment, the dominant characteristic (e.g., channel resistance, wire resistance, coupling capacitance, etc.) can impact timing or delay of a signal transition through an inversion stage.

Again, much of the detailed description is directed to exemplary role resistant components that include a transistor channel resistance of an driving inverter gate while coupling components are described as metal layer wires. It is appreciated that a variety of components can be utilized as role resistance components (e.g., any type of component that can be utilized to influence the comparative impact of a coupling component resistance on a transition timing or delay, etc.) and any type of coupling component (e.g., metal layer wire, trace, line etc.). In one embodiment, the greater the resistance of the role resistance component, the lesser the comparative respective impact of a coupling component resistance on a signal transition delay.

In one embodiment, a plurality of metal sensitive ring oscillators are included in a metal layer. In one embodiment, a four ring oscillator strategy is employed for each individual metal layer. In one embodiment, a four ring oscillator configuration is included in each individual metal layer. The four ring oscillators can be organized into two groups or sets each with two ring oscillators. The first set can include ring oscillators that have a high channel resistance relative to a coupling or wire resistance. The second set can have a low channel resistance relative to a coupling or wire resistance. In one embodiment, within each set, there are two ring oscillators, a first ring oscillator with a high coupling capacitance relative to another inversion stage or coupling component in another ring oscillator, and a second ring oscillator with a low coupling capacitance relative to another inversion stage or coupling component in another ring oscillator. In one embodiment, examination and analysis of ring oscillator features and characteristics includes indications of both wire capacitance and wire resistance.

Figure 3:
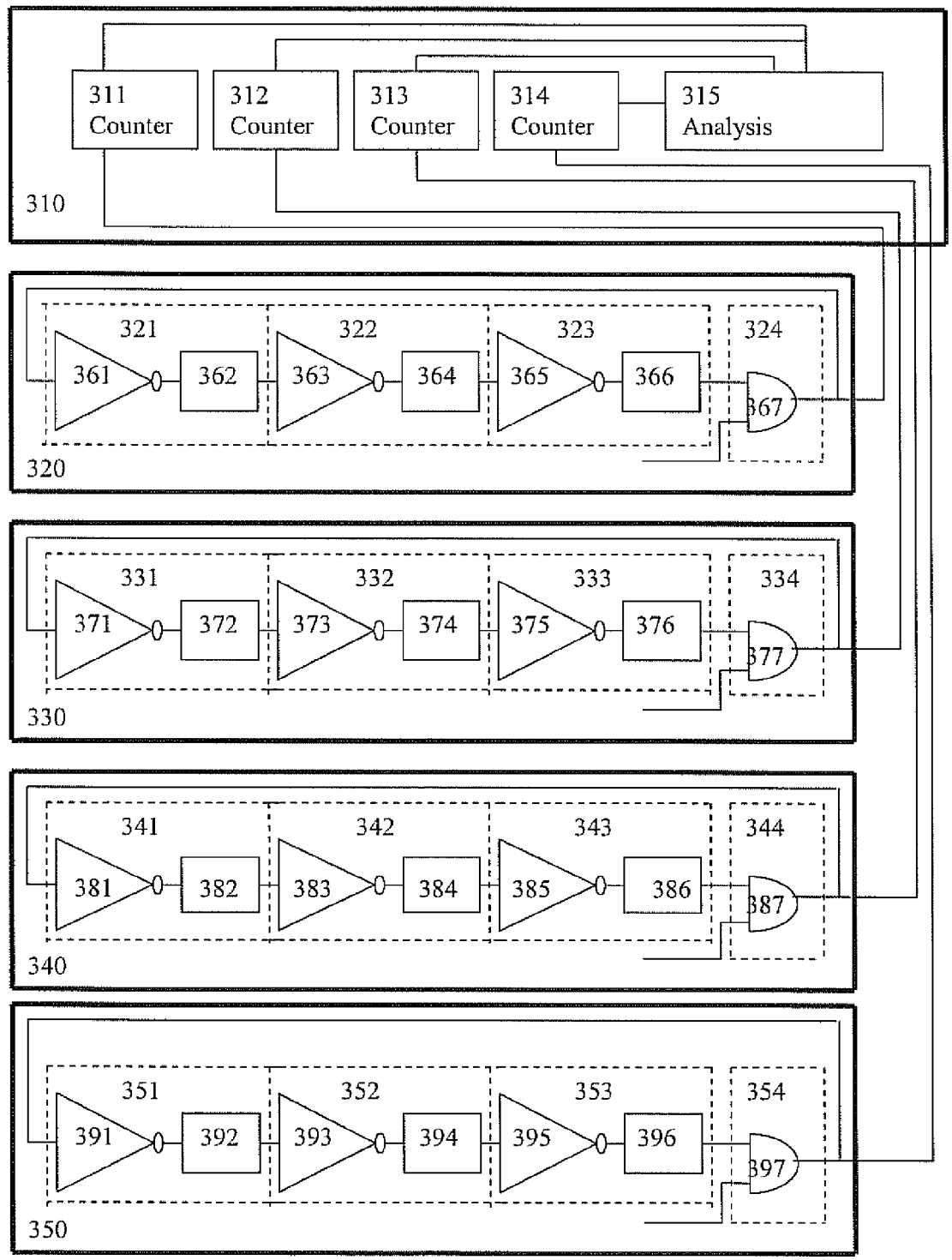
FIG. 3 is a block diagram of an exemplary dominant characteristic analysis system in accordance with one embodiment of the present invention.

FIG. 3 is a block diagram of exemplary dominant characteristic analysis system 300 in accordance with one embodiment of the present invention. In one embodiment, dominant characteristic analysis system 300 is similar to dominant characteristic analysis system 300. Dominant characteristic analysis system 300 includes analysis component 310, dominant characteristic ring oscillator 320, dominant characteristic ring oscillator 330, dominant characteristic ring oscillator 340, and dominant characteristic ring oscillator 350. Analysis component 310 includes counter 311, counter 312, counter 313 and counter 314 and analysis component 350. Counter 311 is coupled to dominant ring oscillator 320, counter 312 is coupled to dominant ring oscillator 330, counter 313 is coupled to dominant ring oscillator 340 and counter 314 is coupled to dominant ring oscillator 350.

Dominant characteristic ring oscillator 320 includes inversion stages 321, 322 and 323, and controller stage 324. In one embodiment, a dominant characteristic ring oscillator forwards a signal that has been subject to transition delays impacted by relatively high channel resistance and high coupling capacitance. In one exemplary implementation, each respective inversion stage (e.g., 321, 322 and 323) includes a respective high channel resistance inverter (e.g., 361, 363 and 365) and respective high capacitance dominant characteristic coupling component (e.g., 362, 364 and 366). Controller stage 324 includes NAND gate 367.

Dominant characteristic ring oscillator 330 includes inversion stages 331, 332, 333, and controller 334. In one embodiment, a dominant characteristic ring oscillator forwards a signal that has been subject to transition delays impacted by relatively high channel resistance and low coupling capacitance. In one exemplary implementation, each respective inversion stage (e.g., 331, 332 and 333) includes a respective high channel resistance inverter (e.g., 371, 373 and 375) and respective low capacitance dominant characteristic coupling component (e.g., 372, 374 and 376). Controller stage 334 includes NAND gate 377.

Dominant characteristic ring oscillator 340 includes inversion stages 341, 342, 343, and controller 344. In one embodiment, a dominant characteristic ring oscillator forwards a signal that has been subject to transition delays impacted by relatively low channel resistance and high coupling capacitance. In one exemplary implementation, each respective inversion stage (e.g., 341, 342 and 343) includes a respective high channel resistance inverter (e.g., 381, 383 and 385) and respective low capacitance dominant characteristic coupling component (e.g., 382, 384 and 386). Controller stage 344 includes NAND gate 387.

Dominant characteristic ring oscillator 350 includes inversion stages 351, 352, 353, and controller 354. In one embodiment, dominant characteristic ring oscillator forwards a signal that has been subject to transition delays impacted by relatively low channel resistance and low coupling capacitance. In one exemplary implementation, each respective inversion stage (e.g., 351, 352 and 353) includes a respective low channel resistance inverter (e.g., 391, 393 and 395) and respective low capacitance dominant characteristic coupling component (e.g., 372, 374 and 376). Controller stage 354 includes NAND gate 397.

Each counter (e.g., 311, 312, 313 and 341) counts transitions in a respective signal from each respective dominant ring oscillator (e.g., 320, 330, 340 and 350). Counter 311, counter 312, counter 313 and counter 314 are coupled to analysis component 350. Analysis component 350 analyzes the count information to determine the impact of the dominant characteristic of the respective dominant characteristic ring oscillators.

FIG. 4 is a flow chart of exemplary metal analysis method 400 in accordance with one embodiment of the present invention.

In block 410, a dominant characteristic ring oscillation process is performed. In one embodiment, the dominant characteristic ring oscillation process facilitates segregation of coupling capacitance and resistance. In one embodiment, the dominant characteristic ring oscillation process includes pull ups and pull downs of a signal wherein at least one transition is impacted by the dominant characteristic. In one exemplary implementation, the dominant characteristic ring oscillation process includes transitions between a logical 1 state to a logical 0 state. A signal in a first state is received and a signal in a second state is output, wherein a delay between receiving the first logical state signal and outputting the second logical state signal is impacted by a dominant characteristic. In one embodiment, the second logic state is the opposite or inverse of the first logic state. In one embodiment, a resistance current increases or makes the delay longer than would otherwise take if the resistance current was not impacting the transition.

In block 420, an analysis process is performed. In one embodiment, results of the dominant characteristic ring oscillation process are analyzed. It is appreciated that a variety of different analysis can be performed. Insight into metal capacitance and resistance separately for each metal layer can be used to improve process as well as improve process modeling. Significant deviation in any metal layer can be fed back to the process team. Correlation between resistance and capacitance of the various metal layers can be fed back into extraction tool tech files and process margins in timing runs. As capacitance and resistance are segregated, they can be used as a basis for extrapolating to a 3D layout. Getting this information from ring oscillators enables high volume data collection across many production lots, which facilitates more accurate statistical analysis of process drift.

In one embodiment, the analysis includes determining a delay associated with a dominant characteristic of the dominant characteristic ring oscillation process. The delay can be correlated to a process variation. The analysis can include deconvolving transistor speed, deconvolving metal resistance and deconvolving metal capacitance. In one exemplary implementation, analyzing includes: examining a high channel resistance ring oscillator where the metal resistance plays a relatively very small role in a delay; identifying an indication of capacitance change; combining an examination of a low channel resistance ring oscillator with results of the high channel resistance ring oscillator; and determining metal resistance difference between dense and sparse lines.

FIG. 5 is a flow chart of exemplary dominant characteristic ring oscillation process 500 in accordance with one embodiment of the present invention. In one embodiment, a signal is transitioned through inversion stages.

In block 510, a high channel resistance low coupling capacitance process is performed. In one embodiment, the high channel resistance and low capacitance are in an inversion stage. In one exemplary implementation, the high channel resistance is high with respect to or compared to a coupling resistance of the inversion stage. The low coupling capacitance is low with respect to coupling capacitance of another inversion stage.

In block 520, a high channel resistance high coupling capacitance process is performed. In one embodiment, the high channel resistance and high capacitance are in an inversion stage. In one exemplary implementation, the high channel resistance is high with respect to or compared to a coupling resistance of the inversion stage and the low coupling capacitance is low with respect to coupling capacitance of another inversion stage.

In block 530, a low channel resistance low coupling capacitance process is performed. In one embodiment, the high channel resistance and low capacitance are in an inversion stage. In one exemplary implementation, the high channel resistance is a high with respect to or compared to a coupling resistance of the inversion stage and the low coupling capacitance is low with respect to coupling capacitance of another inversion stage.

In block 540, a low channel resistance high coupling capacitance process is performed. In one embodiment, the high channel resistance and high capacitance are in an inversion stage. In one exemplary implementation, the high channel resistance is high with respect to or compared to a coupling or wire resistance of the inversion stage and the low coupling capacitance is low with respect to coupling capacitance of another inversion stage.

FIG. 6 is a flow chart of exemplary analysis process 600 in accordance with one embodiment of the present invention. In one exemplary implementation, analysis process 600 is similar to the analysis process of block 420. In one exemplary implementation, analysis process 600 is similar to the analysis performed by analysis component 101. With reference back to FIG. 1, it is appreciated that analysis component 101 can include a variety of implementations. The analysis component 101 can include components on chip with the dominant characteristic oscillating rings, components off chip from the dominant characteristic oscillating rings, and combination of components on and off chip. It is also appreciated that the analysis component 101 can perform a variety of different analysis. In one exemplary implementation, the analysis can include transition delays, determination of channel resistance, determination of coupling capacitance, manufacturing process compliance and defects, etc.

In block 610, an indication associated with a dominant characteristic is received. In one embodiment, the indication includes transitions in a signal in which at least one transition delay is impacted by a dominant characteristic.

In block 620, a transition delay time is determined, wherein the transition delay time is impacted by a dominant characteristic. It is appreciated that a transition delay can be impacted by a variety of dominant characteristics (e.g., high channel resistance, low channel resistance, high coupling capacitance, low coupling capacitance, etc.).

In block 630, characteristics of a device are analyzed based upon the transition delay time. It is appreciated that a variety of characteristics can be analyzed. In one embodiment, analysis of metal layer characteristics is performed. In one exemplary implementation, the transition delay times can be utilized to examine fabrication processes and device operations. The transition delays can be utilized to extrapolate resistance measurements and coupling capacitance measurements for both components included in an oscillating ring and other components of a semiconductor chip. The other components can include components in an area of a semiconductor chip close to components or with similar characteristics of components of a metal analysis system (e.g., 100, 200, 300, etc.). In one exemplary implementation, measurements associated with a dominant characteristic (e.g., line metal resistance, channel metal resistance, line coupling capacitance, etc.) of ring oscillators is extrapolated based upon transition delays in the ring oscillators and the measurements are extrapolated to analysis and measurement of metal layer characteristics of other components (e.g. arithmetic logic units, registers, etc.) of a semiconductor chip in addition to the ring oscillators.

Figure 7:
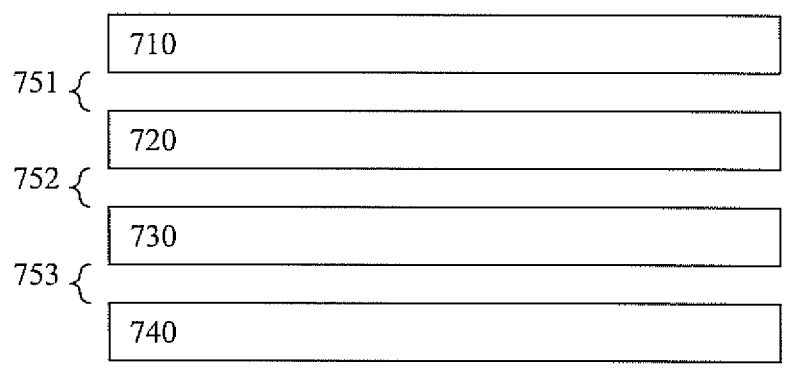
FIG. 7 is a block diagram of an exemplary coupling component in accordance with one embodiment of the present invention.

In one embodiment, the coupling components are coupling lines (e.g., metal lines, etc.). The coupling lines can be spaced to have different capacitive characteristics. FIG. 7 is a block diagram of an exemplary coupling component 700 in accordance with one embodiment of the present invention. In one embodiment, coupling component 700 is similar to coupling components 212, 222, and 223. Coupling component 700 includes lines 710, 720, 730, 740 that are configured with respective spaces or distances 751, 752 and 753 between the lines. In one embodiment, coupling component 700 has a relatively high coupling capacitance dominant characteristic. In one exemplary implementation, the spaces or distance between the lines is kept close to a minimum. In one exemplary implementation, the spaces or distance between the lines is approximately close to the width of the respective lines. In one embodiment, wire capacitance gets multiplied by Miller effect as adjacent wires are driven to opposite voltages approximately simultaneously. In one exemplary implementation each line is approximately 50 nanometers wide and each space is approximately 50 nanometers wide.

Figure 8:
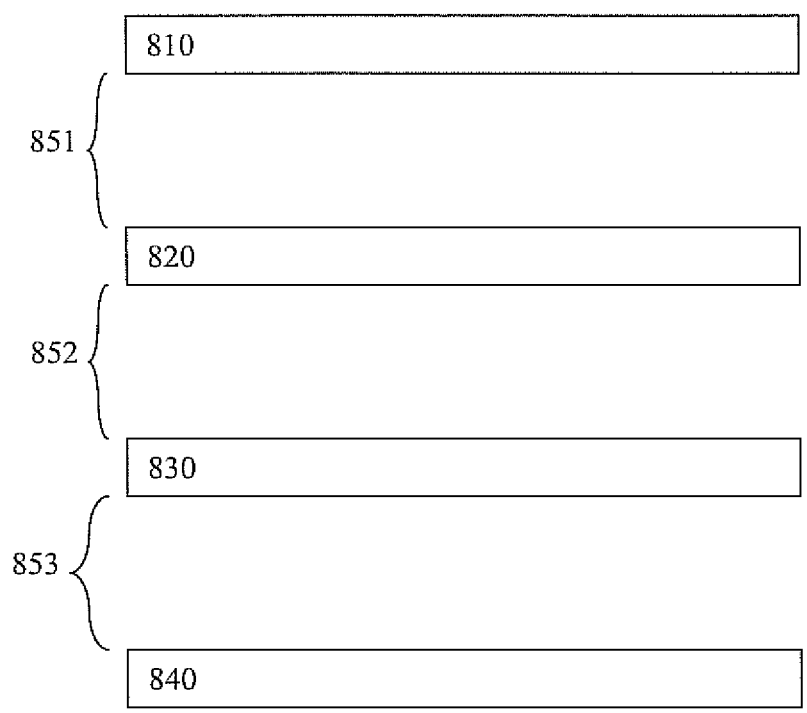
FIG. 8 is a block diagram of an exemplary coupling component in accordance with one embodiment of the present invention.

FIG. 8 is a block diagram of an exemplary coupling component 800 in accordance with one embodiment of the present invention. In one embodiment, coupling component 800 is similar to coupling components 212, 222, and 223.

Coupling component 800 includes lines 810, 820, 830, 840 that are configured with respective spaces or distances 851, 852 and 853 between the lines. In one embodiment, coupling component 800 has a low coupling capacitance dominant characteristic. In one exemplary implementation, the coupling spaces are approximately close to the 2 to 3 times the width of respective lines. In one exemplary implementation each line is approximately 50 nanometers wide and each space is approximately 100 to 150 nanometers wide.

Figure 9:
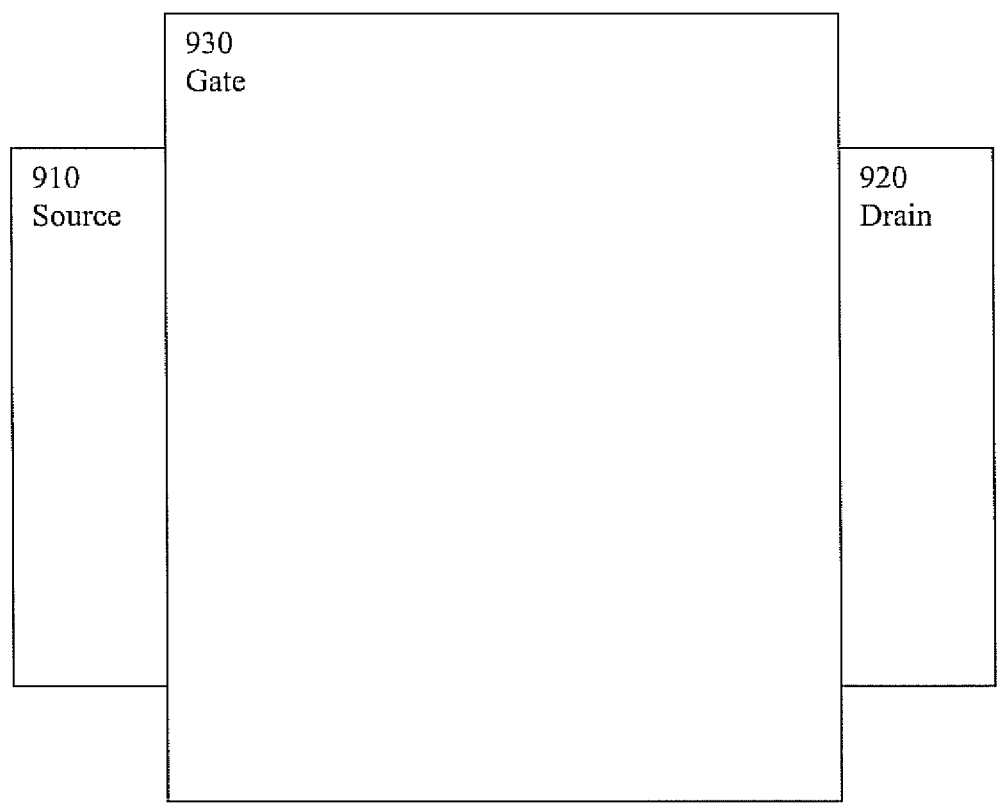
FIG. 9 is a block diagram of an exemplary transistor in accordance with one embodiment of the present invention.

FIG. 9 is a block diagram of exemplary transistor 900 in accordance with one embodiment of the present invention. In one embodiment, transistor 900 is similar to transistors included in inverters 211, 221, and 221. Transistor 900 includes source 910, drain 920 and gate 930. In one embodiment, transistor 900 has a high channel resistance dominant characteristic. In one embodiment, gate 930 is single wide gate. In one exemplary implementation, gate 930 is approximately 250 nanometers wide. In one exemplary implementation, the transistor channel resistance is significantly larger than the metal wire resistance. In one exemplary implementation the transistor channel length is long. In one exemplary implementation there is a small width/length ratio and it is less sensitive to random variation.

Figure 10:
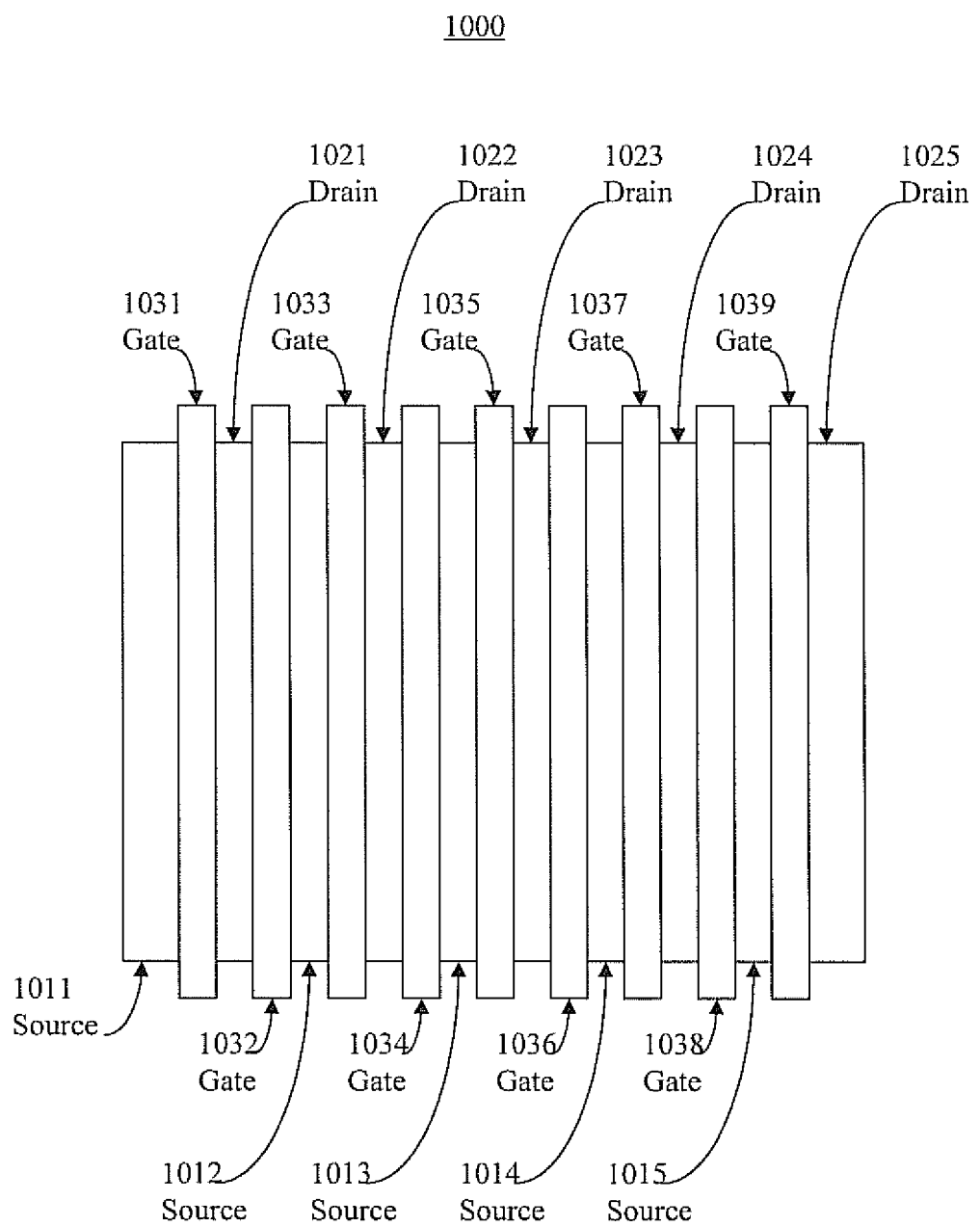
FIG. 10 is a block diagram of an exemplary transistor in accordance with one embodiment of the present invention.

FIG. 10 is a block diagram of exemplary transistor 1000 in accordance with one embodiment of the present invention. In one embodiment, transistor 1000 is similar to transistors included in inverters 211, 221, and 221. Transistor 1000 includes a plurality of source regions (e.g., 1011, 1012, 1013, 1014, and 1015), a plurality of drain regions (e.g., 1021, 1022, 1023, 1024 and 1025) and a plurality of gate regions (e.g., 1031, 1032, 1033, 1034, 1035, 1036, 1037, 1038 and 1039). In one embodiment, transistor 1000 has a low channel resistance dominant characteristic. In one exemplary implementation, the transistor channel resistance is significantly smaller than the metal wire resistance. In one exemplary implementation the transistor channel length is short with a lot of fingers. In one exemplary implementation there is a big width/length ratio and the multiple fingers facilitate reduction in random variation. In one exemplary implementation, the gates are approximately 50 nanometers wide.

In one embodiment, a low drive strength ring oscillator includes a high transistor channel resistance and a signal transition delay is dominated by the transistor channel resistance and wire coupling capacitance. In one exemplary implementation, the coupling capacitance is varied significantly and the wire resistance plays a much less significant role in impacting the signal transition or inversion timing or delay. In one exemplary implementation, the configuration can be utilized to figure out wire coupling capacitance.

In one embodiment, a high drive strength ring oscillator includes a low transistor channel resistance the delay and a transition is dominated by both the transistor channel resistance and wire coupling capacitance. There can be wire metal loads, one with high capacitance and one with low capacitance. In one exemplary implementation, the coupling capacitance is varied significantly but the resistance varies a little (e.g. due to layout effects). The previously extracted capacitance is utilized to calculate the wire resistance. In one embodiment, channel resistance is modulated by modifying the driving inverter gate. A high drive strength gate is used for a low channel resistance driver. A custom designed long channel length gate is used as a high channel resistance gate. The channel length can be designed to increase channel resistance significantly higher than the metal resistance (e.g., a 10 times to 1000 times larger or more, etc.). Random error due to variation "polluted" results can also be considered in channel length design. In one embodiment, it is important to use a long channel inverter as small drive strength min-size devices are very susceptible to random dopant fluctuations. In one exemplary implementation, since the high channel resistance ring oscillator (RO) is going to be transistor dominated, it is important to minimize random error. The high channel resistance RO can be very sensitive to the coupling capacitance of the wire. The coupling capacitance of the wires can be controlled by layout design. Minimum pitch lines can have increased or maximized capacitance and higher space metal lines can have decreased or minimized capacitance. Based on these four data points it is possible to deconvolve transistor speed, metal resistance, and metal capacitance.

Figure 11:
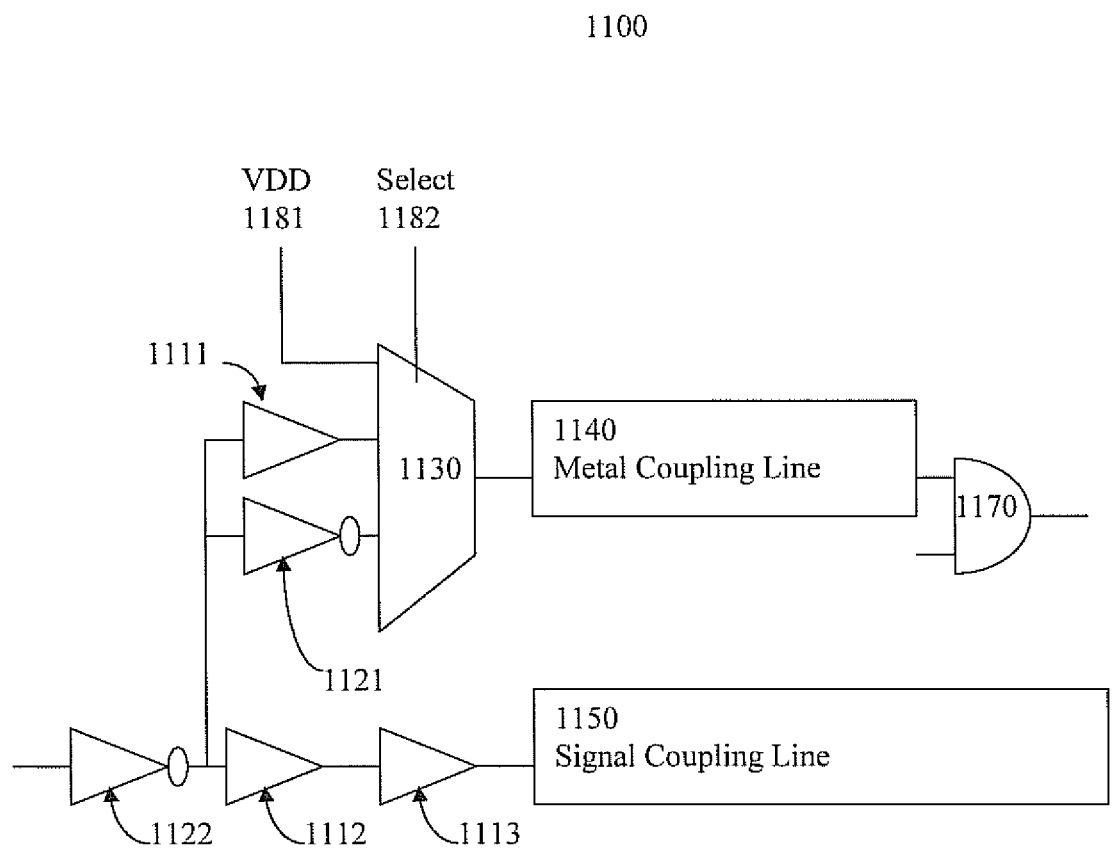
FIG. 11 is a block diagram of an exemplary capacitance modification configuration in accordance with one embodiment of the present invention.

In one embodiment, the capacitance is modified. In one exemplary implementation, only the capacitance is modified. This can be done utilizing a coupling capacitance source that is altered to change with or against the signal being driven. The resistance is fixed as it is the same wire, but the capacitance is changed. FIG. 11 is a block diagram of an exemplary capacitance modification configuration 1100 in accordance with one embodiment of the present invention. Coupling capacitance modification configuration 1100 includes inverters 1121 and 1122, buffers 1111, 1112 and 1113, MUX 1130, metal coupling line 1140, control component 1170 and signal coupling line 1150. Inverter 1121 is coupled to inverter 1121, buffer 1111 and buffer 1112 which is coupled to buffer 1113. MUX 1130 is coupled to inverter 1121, buffer 1111, VDD signal 1181 and select signal 1182. Metal coupling line 1140 is coupled to MUX 1130 and control component 1170. Signal coupling line 1150 is coupled to buffer 1113.

The components of coupling capacitance modification configuration 1100 cooperatively operate to modify the coupling capacitance characteristics. In one embodiment, the coupling capacitance is programmably modified while the resistance is fixed. In one embodiment, coupling capacitance modification configuration 1100 is included in a system similar to system 200. In one exemplary implementation inverter 1122 is similar to an inverter in a role resistance component (e.g., 211, 221, 231, etc.) and signal coupling line 1150 in included in a coupling component (e.g., 212, 222, etc.) and communicatively couples a signal between role resistance components. The MUX 1130 forwards a signal to metal coupling line 1140 in accordance with selection signal 1182. In one embodiment, there are three programmable states including best case, neutral case and worst case. In the best case state, the coupling metal line 1140 is driven with a signal in the same direction or value as a signal on signal coupling line 1150. In the neutral case state, coupling metal line 1140 is driven with a fixed and unchanging value. In one exemplary implementation, MUX 1130 forwards the VDD signal 1181 to the coupling metal line 1140 in a neutral case state. In the worst case state, the coupling metal line 1140 is driven with a signal in the opposite direction or value as a signal on signal coupling line 1150. In one embodiment, buffers 1112 and 1113 introduce a balance delay to achieve substantially simultaneous switching of coupling metal line 1140 and signal coupling line 1150. Control component 1170 can control the output.

Portions of the detailed description are presented and discussed in terms of a method. Although steps and sequencing thereof are disclosed in figures herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed within a computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components Some embodiments may be described in the general context of computer-executable instructions, such as program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

Computing devices can include at least some form of computer readable media. Computer readable media can be any available media that can be accessed by a computing device. By way of example, and not limitation, computer readable medium may comprise computer storage media and communication media. Computer storage media includes volatile and nonvolatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, or any other medium which can be used to store the desired information and which can be accessed by a computing device. Communication media typically embodies computer readable instructions, data structures, program modules, or other data in modulated data signals such as carrier waves or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A system comprising:
    a plurality of dominant characteristic oscillating rings, wherein each respective one of the plurality of dominant characteristic oscillating rings includes at least one dominant characteristic inversion stage with a respective dominant characteristic based upon:
        a coupling resistance relative to a channel resistance; and
        a coupling capacitance relative to a coupling capacitance of another respective one of the plurality of dominant characteristic oscillating rings; and
    an analysis component operable to analyze an indication of the respective dominant characteristic associated with each respective one of the plurality of dominant characteristic oscillating rings and also operable to perform analysis based upon combined results from the each respective one of the plurality of dominant characteristic oscillating rings.

2. A ring oscillator of claim 1 wherein the dominant characteristic includes:
    a high channel resistance relative to a coupling resistance of the at least one dominant characteristic inversion stage; and
    a low coupling capacitance relative to coupling capacitance of another dominant characteristic inversion stage in another one of the plurality of dominant characteristic oscillating rings.

3. A ring oscillator of claim 1 wherein the dominant characteristic includes:
    a high channel resistance relative to a coupling resistance of the at least one dominant characteristic inversion stage; and
    a high coupling capacitance relative to coupling capacitance of another dominant characteristic inversion stage in another one of the plurality of dominant characteristic oscillating rings.

4. A ring oscillator of claim 1 wherein the dominant characteristic includes:
    a low channel resistance relative to a coupling resistance of the at least one dominant characteristic inversion stage; and
    a high coupling capacitance relative to coupling capacitance of another dominant characteristic inversion stage in another one of the plurality of dominant characteristic oscillating rings.

5. A ring oscillator of claim 1 wherein the dominant characteristic includes:
   a low channel resistance relative to a coupling resistance of the at least one dominant characteristic inversion stage; and
   a low coupling capacitance relative to coupling capacitance of another dominant characteristic inversion stage in another one of the plurality of dominant characteristic oscillating rings.

6. The system of claim 1 wherein the analyzing includes identifying process variations based upon the indication of the dominant characteristic.

7. A method comprising:
   performing a dominant characteristic ring oscillation process, including facilitating segregation of coupling associated non-gate characteristics from non-coupling associated characteristics; and
   analyzing results of the dominant characteristic ring oscillation process, wherein the analysis includes determining a delay associated with a dominant characteristic of the dominant characteristic ring oscillation process.

8. The method of claim 7 wherein the analysis includes correlating a delay associated with at least one of a dominant characteristic oscillation rings to a process variation.

9. The method of claim 7 wherein the analysis includes deconvolving transistor speed.

10. The method of claim 7 wherein the analysis includes deconvolving metal resistance.

11. The method of claim 7 wherein the analysis includes deconvolving metal capacitance.

12. The method of claim 7 wherein the analyzing comprises:
   examining a high channel resistance ring oscillator where metal resistance plays a relatively very small role in delay;
   identifying an indication of capacitance change;
   combining an examination of a low channel resistance ring oscillator with results of the high channel resistance ring oscillator; and
   determining the metal resistance difference between dense and sparse lines.

13. A ring oscillator comprising:
   at least one inversion stage including an inverter and coupling component, wherein the inversion stage includes a dominant characteristic that impacts a transition of a signal through a ring path, and the dominant characteristic facilitates segregation of coupling associated non-gate characteristics from non-coupling associated characteristics; and
   an output operable to output an indication of the impact the dominant characteristic has on the transition of the signal through the ring path.

14. A ring oscillator of claim 13 wherein the dominant characteristic includes:
   a high channel resistance relative to a coupling resistance of the at least one inversion stage; and
   a high coupling capacitance relative to another inversion stage in another ring oscillator.

15. A ring oscillator of claim 13 wherein the dominant characteristic includes:
   a high channel resistance relative to a coupling resistance of the at least one inversion stage; and
   a low coupling capacitance relative to another inversion stage in another ring oscillator.

16. A ring oscillator of claim 13 wherein the dominant characteristic includes:
   a low channel resistance relative to a coupling resistance of the at least one inversion stage; and
   a high coupling capacitance relative to another inversion stage in another ring oscillator.

17. A ring oscillator of claim 13 wherein the dominant characteristic includes:
   a low channel resistance relative to a coupling resistance of the at least one inversion stage; and
   a low coupling capacitance relative to another inversion stage in another ring oscillator.

18. The ring oscillator of claim 13 wherein said output is coupled to an analysis component.

19. The ring oscillator of claim 13 further comprising a control component coupled to the ring path to control a state of the signal.

* * * * *